United States Patent [19]

Green et al.

[11] Patent Number: 5,457,459
[45] Date of Patent: Oct. 10, 1995

[54] ANALOG TO DIGITAL CONVERTER FOR CHARGE COUPLED SIGNALS

[75] Inventors: Paul E. Green, La Mirada; Barry T. French, Fullerton, both of Calif.

[73] Assignee: Rockwell International Corporation, Seal Beach, Calif.

[21] Appl. No.: 137,364

[22] Filed: Oct. 18, 1993

[51] Int. Cl.$^6$ ........................................................ H03M 1/38
[52] U.S. Cl. ................................................................ 341/172
[58] Field of Search .................................... 341/150, 172

[56]   References Cited

U.S. PATENT DOCUMENTS

| | | | |
|---|---|---|---|
| 3,903,543 | 9/1975 | Smith | 341/172 |
| 4,194,187 | 5/1980 | Glendinning | 341/172 |
| 4,277,694 | 7/1981 | Jensen | 341/172 |
| 4,333,022 | 6/1982 | Whelan et al. | 341/172 |
| 5,010,340 | 4/1991 | Green | 341/172 |

*Primary Examiner*—Howard L. Williams
*Attorney, Agent, or Firm*—George A. Montanye; David J. Arthur; Philip K. Yu

[57]   ABSTRACT

An apparatus and method for converting a charge packet into digital bit weights. The apparatus comprises a plurality of serially connected charge-coupled cells for receiving the charge packet at one end, such that the charge packet consecutively fills each CCD in the path. Also, a detector is coupled to another end of the CCD's for advancing charge within the CCD's and detecting whether each CCD is filled. A counter coupled to the detector for counting the number of CCD's which are not filled with charge, wherein the number represents a first form of digital bit weights of the charge packet.

10 Claims, 3 Drawing Sheets

ANALOG TO DIGITAL CONVERTER FOR CHARGE COUPLED SIGNALS

This invention was made with Government support under Contract No. DASG60-90-C-0136 awarded by the Army. The Government has certain rights in this invention.

BACKGROUND OF THE INVENTION

The present invention relates to analog to digital converters (ADC) and more particularly to ADC's for converting charge-based signals.

Conventional ADC's operate by comparing a sampled analog voltage to a reference voltage, and adjusting the reference voltage until a null output is obtained. The digital device used for adjusting the reference voltage is then decoded and read out as the digital equivalent of the analog signal. This type of conversion of a signal from either voltage or charge to equivalent digital bit weights typically poses two major problems. First, it is often difficult to establish an exacting ratio between each successive bits. The conventional solution has been to trim the bit weights either mechanically or electronically, which has not achieved the accuracy desired in high precision ADC processes.

Second, power dissipation is always a major concern in conversion systems using amplifiers, comparators, and resistor ladders. Heat generated in the conversion processes by those components may be transferred to the detectors, which are usually placed adjacent to the signal processing circuitry.

Therefore, it is an object of the present invention to convert a charge packet representative of a signal into digital bit weights for further signal processing in a simplified manner.

It is also an object of the present invention to obviate the need to establish an exacting ratio between each successive bits in the conversion process.

It is another object of the present invention to reduce power dissipation generated by the conversion process.

SUMMARY OF THE INVENTION

An apparatus and method for converting a charge packet into digital bit weights is disclosed. The apparatus comprises a plurality of serially connected charge-coupled cells forming a charge-coupled device (CCD) for receiving the charge packet at one end and advancing charge from the charge packet in a serial path according to a predetermined gate level, such that the charge packet consecutively fills each CCD cell in the path. Also, a detector is coupled to the other end of the CCD cells for detecting advancing charge within the CCD's, detecting whether each CCD cell is filled or empty. A counter coupled to the detector for counting the number of CCD cells which are not filled with charge, wherein the number represents a first form of digital bit weights of the charge packet.

DETAILED DESCRIPTION OF THE PREFERRED EMBODIMENT

Figure 1:
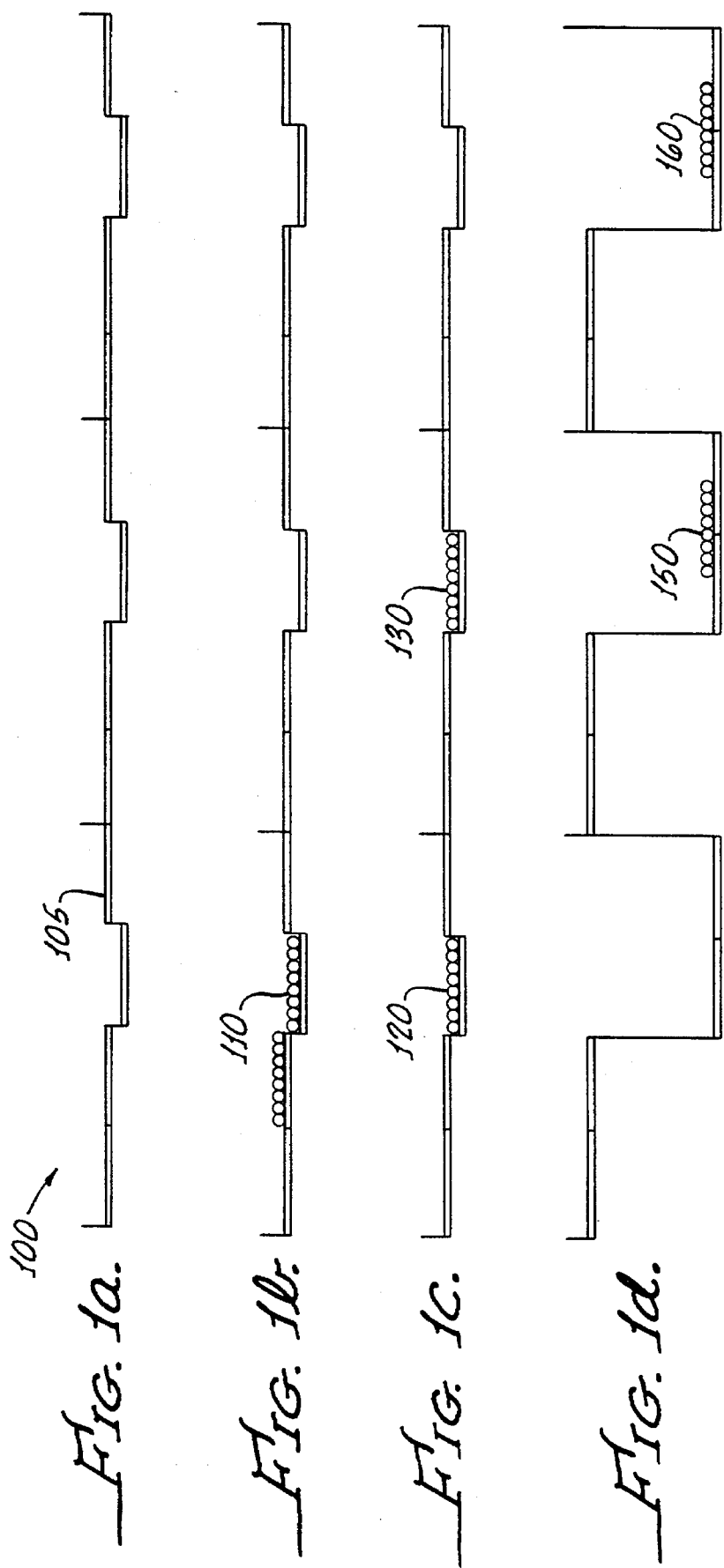
FIG. 1 is a simplified functional block diagram of the present invention.

As illustrated in FIG. 1(a), three CCD cells 100 are shown biased so that most of the cell gates form a uniform well. While the figure shows a 4 gated cell, cells of other gate counts could be used. One gate in each cell forms a small charge bucket lower than the uniform well 105. Charge packet 110 enters CCD 100 FIG. 1(b). The charge packet advances to fill the CCD cells in its path. As such, CCD's 100 is operating like a series of charge buckets, where each bucket that is filled by charge from the charge packet represents a least significant digital bit weight.

Due to CCD design principles, charge packet 105 must fill each bucket consecutively in its path, as should be understood by those skilled in the art. The buckets in CCD 100 stop filling when charge packet 105 is entirely stored by the requisite number of buckets FIG. 1(c). At this time, the number of buckets holding charge represents a digital quantity such that an analog signal, i.e. charge packet, is now represented in a quantified form, i.e number of buckets filled with charge.

Figure 2:
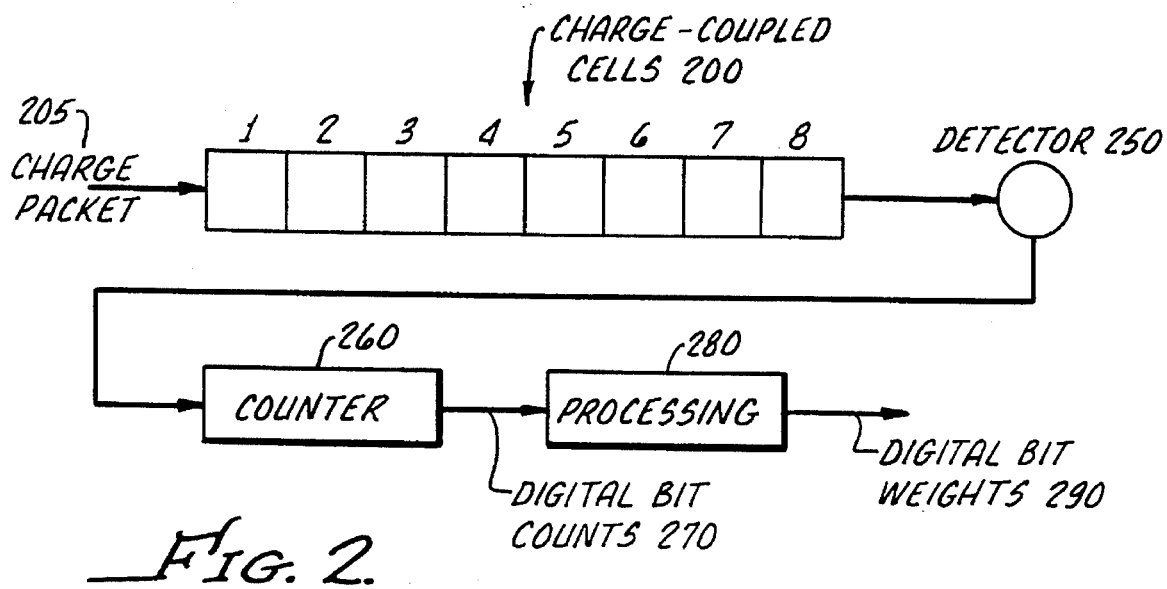
FIG. 2 is a system block diagram of the present invention in one embodiment.

Reference is now made to FIG. 2, where a functional block diagram of the present invention is shown. A series of charge-coupled cells 200 forms a CCD and receives charge packet 205 at one end and outputs it to detector 250. Detector 250 is connected to counter 260, which generates digital bit counts, representative of the charge packet. The digital bit counts 270 are also input to processing circuit 280 for further operation.

As will be appreciated by those skilled in the art, CCD's 100 is now clocked by its multi-phase clocks FIG. 1(d) to shift the charge through. With reference made to FIG. 2, detector 250 now reads out each bucket as CCD's 200 shifts its stored charges out through cell 8. Whenever an empty cell is detected, counter 260 registers it. The detecting and counting process continues until a cell with charge is detected while counter 260 registers and shifts its 1's. As will be appreciated by those skilled in the art, knowing the number of empty buckets out of the total number of buckets will lead to the number of filled buckets. Alternately the numbers of full buckets could be counted.

As an example, assuming cells 1, 2, and 3 are filled, then detector 250 would detect empty cells from cell 8 through cell 4 and counter 260 would register and shift five consecutive bits of 1's with the remaining three bits being 0's. As previously described, the value 270 obtained from counter 260 is already in a form of digital bit weights, which can be manipulated to show the magnitude of charge packet 205 in that it is now known 5 out of 8 cells within CCD's 100 are empty.

Further processing may be implemented by processing circuit 280 to derive the number of cells occupied with charge from the number of empty cells, thus another form of digital bit weights 290 for the magnitude of charge packet 205. Referring to the above example, five empty cells (from cells 4 to 8) detected would make the counter shift and record 270, from MSB to LSB, "1 1 1 1 1 0 0 0" corresponding to cells "8 7 6 5 4 3 2 1", respectively. The count "11111000" can be readily interpreted as representing 5 empty buckets out of 8, or 3 full buckets out of 8, as will be appreciated by those skilled in the art.

Figure 3:
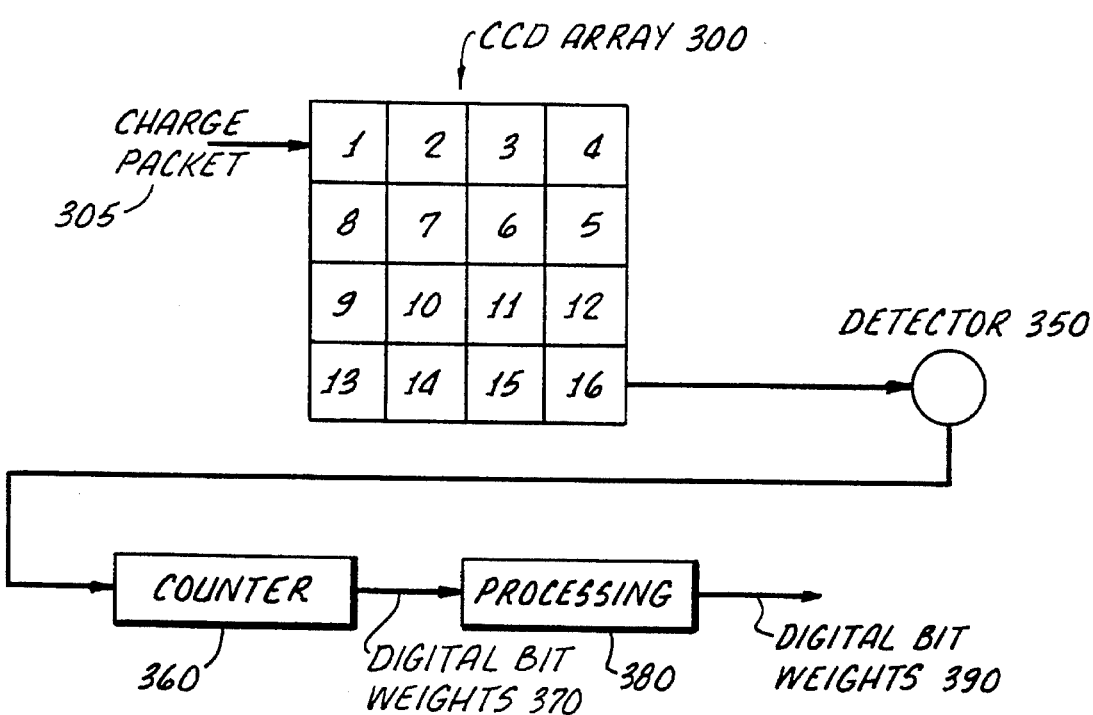
FIG. 3 is a simplified system diagram of the present invention in another embodiment.

Reference is now made to FIG. 3, where a simplified system block diagram of one embodiment of the present invention is shown. CCD's 300 is now structured to form an array, with input at cell 1 and output at cell 16. Since charge must fill each cell in CCD array 300 consecutively, a serpentine transfer path is formed. Those skilled in the art will appreciate that a CCD array offers the compactness typically desired in high density silicon devices. By the same operating principle as described in connection FIG. 1, after charge packet is entirely stored in CCD array 300, cells are consecutively read out by detector 350 from cell 16 until a "filled" cell is detected. Counter 360 registers and shifts bits of 1's as each empty cell is detected by detector 350 to produce one form of digital bit weights 370, which can be translated by processor 380 into another form of digital bit weights 390. Those skilled in the art should be able to appreciate that either form could be used to represent the magnitude of charge packet 305, whether it is the number of empty cells or the number of filled cells.

Figure 4:
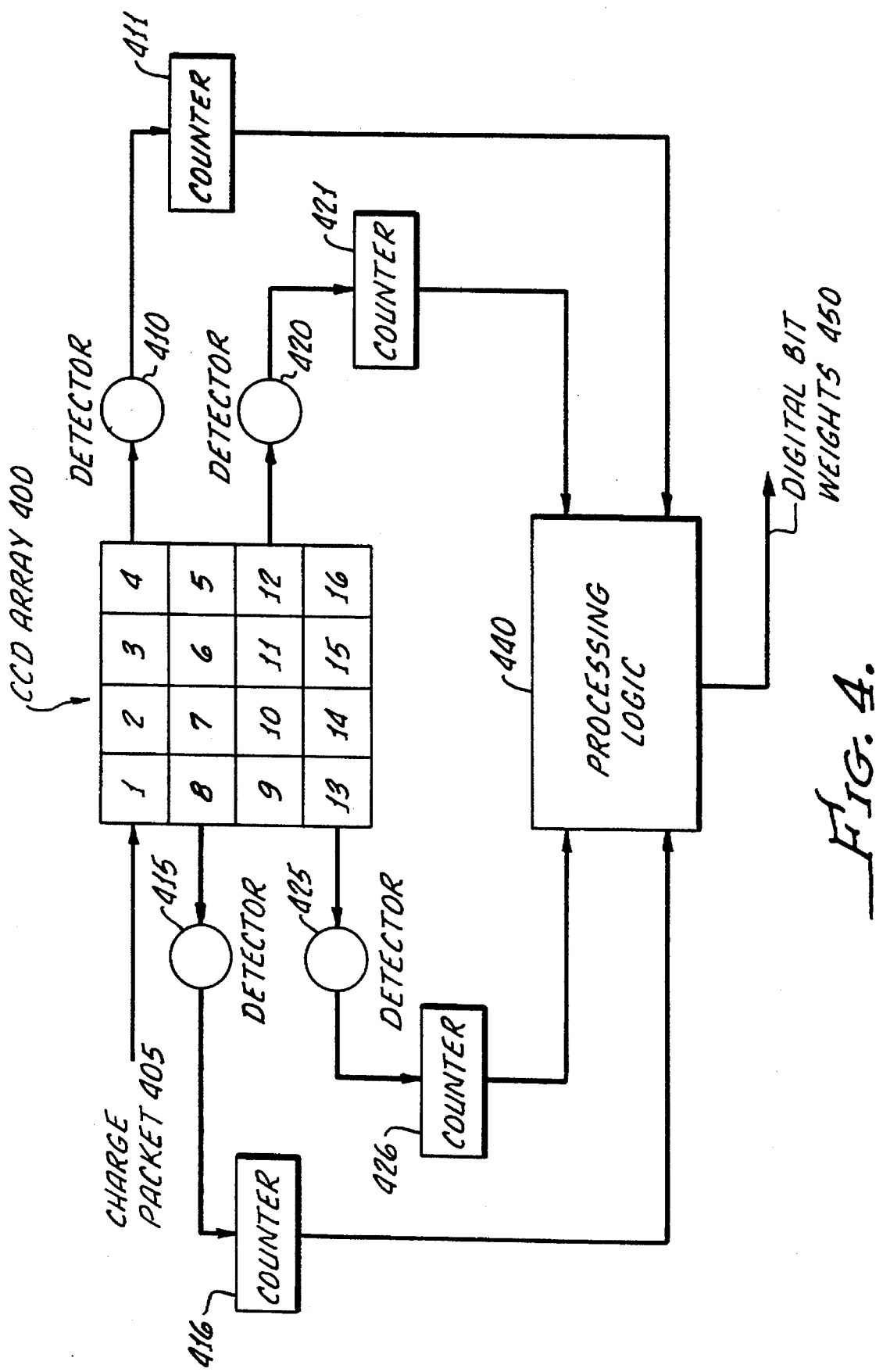
FIG. 4 is a system block diagram of a further embodiment of the present invention.

Reference is now made to FIG. 4, where a system block diagram of another embodiment of the present invention is illustrated. Note that cells at fixed intervals, cells 4, 8, 12 and 16 of CCD array 400, are connected to their individual output detector, 410, 415, 420, and 425, respectively. As shown in FIG. 4, each row has its own counter circuits 411, 416, 421 and 426, to detect the empty cells in each section of CCD array 400. This way, CCD array 400 is only required to shift, at the most, one row cycle to determine the number of empty cells within CCD 400. Obtaining all the numbers of empty rows would provide the desired form of digital bit weights as previously described. The processing logic performs this operation 440.

For example, once charge packet 405 is loaded onto CCD array 400 the array is divided into four rows. Only one cell shift for each row is required before detector 410 detects charge transferred from cell 3. Concurrently, cells 8, 12 and 16 detect empty cells. However, since a first filled cell is detected by detector 410 as charge is shifted from cell 3 to cell 4, cells 5–16 must be empty. The total number of empty cells would thus be 1+4+4+4=13, as will be appreciated by those skilled in the art, while the number of filled cells would thus be 16–13=3. As a result, the time required for detecting and counting is reduced. And in this particular example, only four shifts are needed instead of the 16 shifts needed for a single detector as in FIG. 2 to completely examine the CCD.

Another example of the efficiency of the system according to FIG. 4 is now described. Assuming charge packet 405 fills CCD array 400 up to cell 10, i.e. from cells 1–10, two shifts would be required to shift cell 10 to cell 12 for the detection of a filled cell by detector 420, while charges appearing from cells 1–8 indicate no empty cells because a filled cell indicates all the cells behind it must be filled. Thus, the number of filled cells from cells 1–4 and cells 5–8, coupled with the number of filled cells translated from the number of empty cells from cells 9–12, will provide the desired digital bit weights for charge packet 405.

What is claimed is:

1. An apparatus for converting a charge packet into digital bit weights, comprising:

a plurality of serially connected charge-coupled device ("CCD") receiving said charge packet at one end and advancing charge from said charge packet, such that said charge packet consecutively fills each CCD cell in said path;

Charge advancing means coupled to said CCD cells for advancing said charge pocket;

detecting means coupled to another end of said CCD cells for detecting whether each of said CCD cells is filled;

counter means coupled to said detecting means for counting the number of CCD cells which are not filled with charge, wherein said number represents a first form of digital bit weights of said charge packet.

2. An apparatus according to claim 1, further comprising: processing means coupled to said counter means for complementing the number of CCD cells which are not filled with charge to obtain the number of CCD cells filled with charge, wherein said second number represents a second form of digital bit weights of said charge packet.

3. An apparatus according to claim 1, wherein said plurality of serially connected CCD cells is formed as an array having a substantially serpentine transfer path.

4. An apparatus according to claim 3, further comprising:

a plurality of detectors, each detector being connected to one of said array formed by said CCD cells at a fixed interval from one another;

wherein said counter means comprises a plurality of counters with each counter coupled to each detector at the interval to count the number of empty CCD cells within each interval;

and processing means for determining the digital bit weights of said charge packet by summing the numbers of empty CCD cells from said plurality of counters.

5. An apparatus for converting a charge packet into digital bit weights, comprising:

a plurality of serially connected charge-coupled device ("CCD") cells for receiving said charge packet at one end and advancing charge from said charge packet, such that said charge packet consecutively fills each one of said CCD cells in its path;

a plurality of detectors, each detector coupled to one of said CCD cells at a fixed interval from one another such that each interval has its individual detector, for advancing charge stored in said CCD cells through and detecting whether each of said CCD cells is filled with charge;

a plurality of counters, each coupled to one of said detector for counting the number of CCD cells which are not filled with charge; and processing means coupled to said plurality of counters for determining said digital weighted bits corresponding to said charge packet by summing the numbers of empty CCD cells from each interval and complementing the sum to obtain the number of CCD cells filled with charge, wherein the number represents the digital bit weights of said charge packet.

6. An apparatus according to claim 5, wherein said plurality of CCD cells is formed as an array with a substantially serpentine transfer path.

7. An apparatus according to claim 6, wherein said plurality of CCD cells forms a 8 by 8 array with an individual detector coupled to each row.

8. A method for converting a charge packet into digital bit weight, comprising the steps of:

inputting said charge packet into one end of a plurality of serially connected CCD cells;

advancing charge from said charge packet through said CCD cells until said charge packet is completely held by at least a subset of said CCD cells;

outputting charge from another end of said CCD cells;

detecting whether each of said CCD cells holds a charge as charge is transferred out;

counting the number of empty CCD cells until a filled CCD cell is detected;

complementing the number of empty CCD cells to obtain the number of filled CCD cells, wherein said number of filled CCD cells represents said digital bit weight for said charge packet.

9. A method according to claim 8, wherein:

the step of advancing said charge advances said charge in a serpentine path.

10. A method according to claim 9, wherein:

the step of detecting occurs concurrently at a fixed interval on said serpentine path by one of a plurality of detectors coupled to said fixed interval and the step of counting combines the result from said plurality of detectors through a corresponding plurality of counters coupled to said plurality of detectors to obtain a total number of empty CCD cells.

* * * * *